(12) United States Patent
Zou et al.

(10) Patent No.: US 10,306,372 B2
(45) Date of Patent: May 28, 2019

(54) FULLY WAFER-LEVEL-PACKAGED MEMS MICROPHONE AND METHOD FOR MANUFACTURING THE SAME

(71) Applicant: GOERTEK INC., WeiFang, Shandong (CN)

(72) Inventors: Quanbo Zou, WeiFang (CN); Zhe Wang, WeiFang (CN)

(73) Assignee: GOERTEK INC., WeiFang, Shandong (CN)

( * ) Notice: Subject to any disclaimer, the term of this patent is extended or adjusted under 35 U.S.C. 154(b) by 0 days.

(21) Appl. No.: 15/311,152

(22) PCT Filed: Aug. 26, 2014

(86) PCT No.: PCT/CN2014/085222
§ 371 (c)(1),
(2) Date: Nov. 14, 2016

(87) PCT Pub. No.: WO2016/029365
PCT Pub. Date: Mar. 3, 2016

(65) Prior Publication Data
US 2017/0164117 A1 Jun. 8, 2017

(51) Int. Cl.
*H04R 3/00* (2006.01)
*H04R 17/02* (2006.01)
(Continued)

(52) U.S. Cl.
CPC .......... *H04R 19/005* (2013.01); *B81B 3/001* (2013.01); *B81B 7/00* (2013.01); *B81C 1/0023* (2013.01);
(Continued)

(58) Field of Classification Search
CPC .............. H04R 19/04; H04R 19/016; H04R 2201/003; H04R 31/006; H04R 29/004;
(Continued)

(56) References Cited

U.S. PATENT DOCUMENTS

2004/0063237 A1* 4/2004 Yun .................. B81C 1/00357
438/48
2005/0166677 A1* 8/2005 Nasiri .................. B81C 1/0023
73/514.16
(Continued)

FOREIGN PATENT DOCUMENTS

CN 101150886 A 3/2008
CN 101998213 A 3/2011
(Continued)

OTHER PUBLICATIONS

International Search Report dated Dec. 9, 2014 of PCT/CN2014/085222 which is the parent application—2 pages.
(Continued)

*Primary Examiner* — George C Monikang
(74) *Attorney, Agent, or Firm* — Knobbe Martens Olson & Bear LLP

(57) ABSTRACT

The present invention provides a method for manufacturing a fully wafer-level-packaged MEMS microphone and a microphone manufactured with the same, the method comprises: separately manufacturing a first packaging wafer, an MEMS microphone wafer and a second packaging wafer; performing wafer-to-wafer bonding for the three wafers to form a plurality of fully wafer-level-packaged MEMS microphone units; singulating the fully wafer-level-packaged MEMS microphone units to form a plurality of fully wafer-level-packaged MEMS microphones, which are fully packaged at wafer level and do not need any further process after die singulation. The method can improve cost-effectiveness, performance consistency, manufacturability, quality, scaling capability of the packaged MEMS microphone.

15 Claims, 6 Drawing Sheets

(51) Int. Cl.
  *H04R 9/06* (2006.01)
  *H04R 19/00* (2006.01)
  *B81B 7/00* (2006.01)
  *H04R 19/04* (2006.01)
  *H04R 31/00* (2006.01)
  *B81B 3/00* (2006.01)
  *B81C 1/00* (2006.01)

(52) U.S. Cl.
  CPC .............. *H04R 19/04* (2013.01); *H04R 31/00* (2013.01); *H04R 31/006* (2013.01); *B81B 2201/0257* (2013.01); *B81B 2203/0127* (2013.01); *B81B 2203/04* (2013.01); *B81B 2207/012* (2013.01); *B81C 2203/0118* (2013.01); *B81C 2203/058* (2013.01); *B81C 2203/0785* (2013.01); *H04R 2201/003* (2013.01)

(58) Field of Classification Search
  CPC ........ H04R 1/04; H04R 1/406; B81C 1/0023; H01L 2224/48247; H01L 2924/15151
  USPC .................................................. 381/111–115
  See application file for complete search history.

(56) References Cited

U.S. PATENT DOCUMENTS

2011/0216922 A1* 9/2011 Li .......................... H04R 25/00
                                                                381/174
2011/0248364 A1    10/2011 Huang et al.

FOREIGN PATENT DOCUMENTS

| CN | 1960580 B     | 6/2011  |
| CN | 102404676 A   | 4/2012  |
| CN | 102726065 A   | 10/2012 |

OTHER PUBLICATIONS

Office Action of corresponding Chinese Patent Application No. 201480003820.4—30 pages, (Feb. 13, 2018).

* cited by examiner

FULLY WAFER-LEVEL-PACKAGED MEMS MICROPHONE AND METHOD FOR MANUFACTURING THE SAME

FIELD OF THE INVENTION

The present invention relates to the field of microphone technology, and more specifically, to a packaged MEMS microphone and a method for manufacturing the same.

BACKGROUND

The silicon based MEMS (Microelectromechanical System) microphones, also known as acoustic transducers, are playing a more and more important role in the hearing instrument, mobile communication system, digital camera, video camera and toy industry. Usually, a silicon based MEMS microphone chip needs to be packaged before it can be tested, shipped and utilized. U.S. Pat. No. 6,781,231 disclosed a typical MEMS package as shown in FIG. 1, which comprises surface mountable components 12 (e.g., a silicon based MEMS microphone chip, integrated circuits), substrate 14, and a cover 20, wherein the combination of the substrate 14 and the cover 20 forms a housing 22 in which the surface mountable components 12 are located and electrically connected.

However, there are several drawbacks to this MEMS package and its like. Firstly, it is not cost-effective. Packaging cost generally takes a major portion of the total cost for such a conventional packaged MEMS microphone, for example, for a typical 6 mm$^2$ package size, the minimum packaging cost may exceed $0.1, whilst a typical MEMS microphone chip costs much less than $0.1. Especially, when package size is further reduced, which is a growing trend, packaging cost will become a cost-down bottle neck. Secondly, it is disadvantageous in manufacturability and mass production, since the singulated MEMS microphone chips needs to be packaged separately. Thirdly, performance consistency may not be guaranteed, particle and organic contaminations may not be easily prevented. Fourthly, size reduction of the MEMS package is highly limited due to its incompact structure.

To overcome the above drawbacks to the conventional packaged MEMS microphone, the present invention suggests a fully wafer-level-packaging technique for packaging a silicon based MEMS microphone. Actually, U.S. Pat. No. 8,368,153 discloses a wafer level package of MEMS microphone, as shown in FIG. 2, and manufacturing method thereof. However, the US patent application only discloses a chip structure of an MEMS microphone and a wafer process flow for manufacturing the same, the structure is actually not a packaged MEMS microphone which is surface mountable, and still requires traditional acoustic packaging after wafer process. Therefore, a fully wafer-level-packaged MEMS microphone, which is fully packaged at wafer level and does not need any further process after die singulation, and a method for manufacturing the same are still not applicable.

SUMMARY

In view of the above, the present invention provides a fully wafer-level-packaged MEMS microphone and a method for manufacturing the same with an objective of improving cost-effectiveness, performance consistency, manufacturability, quality, scaling capability of the packaged MEMS microphone.

According to an aspect of the present invention, there is provided a method for manufacturing a fully wafer-level-packaged MEMS microphone, comprising: separately manufacturing a first packaging wafer, an MEMS microphone wafer and a second packaging wafer, wherein the first packaging wafer comprises a plurality of first packaging units, the second packaging wafer comprises a plurality of second packaging units, and the MEMS microphone wafer comprises a plurality of MEMS microphone units, each of which comprises a silicon substrate formed with a back hole therein and an acoustic sensing part supported on the silicon substrate and aligned with the back hole, and wherein the first packaging units and/or the second packaging units and/or the MEMS microphone units comprise ASICs, and the first packaging units or the second packaging units also comprise acoustic ports; performing wafer-to-wafer bonding for the MEMS microphone wafer and the first packaging wafer and for the second packaging wafer and the MEMS microphone wafer, such that the first packaging units, the MEMS microphone units and the second packaging units are correspondingly aligned to form a plurality of fully wafer-level-packaged MEMS microphone units, in each of which the electrical connections among the acoustic sensing part, the ASICs and surface mountable pads formed on the outer side of the first packaging unit and/or the outer side of the second packaging unit are realized by interconnection wires or conductive pads or through-silicon-vias or the combination thereof; and singulating the fully wafer-level-packaged MEMS microphone units to form a plurality of fully wafer-level-packaged MEMS microphones.

Preferably, the acoustic sensing part may at least includes: a compliant diaphragm; a perforated backplate; and an air gap formed between the diaphragm and the backplate, wherein the diaphragm and the backplate are used to form electrode plates of a variable condenser.

Preferably, the wafer-to-wafer bonding may be realized by any of metal-metal bonding, metal eutectic bonding, soldering, and conductive adhesive bonding.

In one embodiment, preferably, in each of the fully wafer-level-packaged MEMS microphone units, the first packaging unit may comprise the ASICs and an acoustic port, the second packaging unit may comprise a cavity, the back hole in the MEMS microphone unit and the cavity may be merged to form a back chamber, and the surface mountable pads may be formed on the outer side of the first packaging unit. Further preferably, the acoustic sensing part may include a perforated backplate supported on the silicon substrate and a compliant diaphragm supported on the backplate with an air gap sandwiched inbetween, and dimples may be formed on the inner side of the first packaging unit to protect the diaphragm from sticking thereto.

In another embodiment, preferably, in each of the fully wafer-level-packaged MEMS microphone units, the first packaging unit may comprise an acoustic port, the second packaging unit may comprise the ASICs, and the surface mountable pads may be formed on the outer side of the first packaging unit. Further preferably, the acoustic sensing part may include a perforated backplate supported on the silicon substrate and a compliant diaphragm supported on the backplate with an air gap sandwiched inbetween, and dimples may be formed on the inner side of the first packaging unit to protect the diaphragm from sticking thereto.

According to another aspect of the present invention, there is provided a fully wafer-level-packaged MEMS microphone, comprising: a first packaging unit; an MEMS microphone unit, comprising a silicon substrate formed with a back hole therein and an acoustic sensing part supported on the silicon substrate and aligned with the back hole; and a second packaging unit, wherein the first packaging unit and/or the second packaging unit and/or the MEMS microphone unit comprise ASICs, and the first packaging unit or the second packaging unit also comprises an acoustic port, wherein the first packaging unit, the MEMS microphone unit and the second packaging unit are aligned, the MEMS microphone unit is bonded to the first packaging unit and the second packaging unit is bonded to the MEMS microphone unit, and wherein the electrical connections among the acoustic sensing part, the ASICs and surface mountable pads formed on the outer side of the first packaging unit and/or the outer side of the second packaging unit are realized by interconnection wires or conductive pads or through-silicon-vias or the combination thereof.

According to still another aspect of the present invention, there is provided a method for manufacturing a fully wafer-level-packaged MEMS microphone, comprising: separately manufacturing a first packaging wafer, an MEMS microphone wafer, wherein the first packaging wafer comprises a plurality of first packaging units, and the MEMS microphone wafer comprises a plurality of MEMS microphone units, each of which comprises a silicon substrate formed with a back hole therein and an acoustic sensing part supported on the silicon substrate and aligned with the back hole, and wherein the first packaging units and/or the MEMS microphone units comprise ASICs; performing wafer-to-wafer bonding for the MEMS microphone wafer and the first packaging wafer with the back hole side of the MEMS microphone wafer being away from the first packaging wafer, such that the first packaging units and the MEMS microphone units are correspondingly aligned to form a plurality of fully wafer-level-packaged MEMS microphone units, in each of which the electrical connections among the acoustic sensing part, the ASICs and surface mountable pads formed on the outer side of the first packaging unit are realized by interconnection wires or conductive pads or through-silicon-vias or the combination thereof; and singulating the fully wafer-level-packaged MEMS microphone units to form a plurality of fully wafer-level-packaged MEMS microphones.

Preferably, in each of the fully wafer-level-packaged MEMS microphone units, the acoustic sensing part and the ASICs may be integrally formed on the MEMS microphone unit, and the surface mountable pads may be formed on the outer side of the first packaging unit. Further, the first packaging unit may comprise a cavity.

According to the yet still another aspect of the present invention, there is provided a fully wafer-level-packaged MEMS microphone, comprising: an MEMS microphone unit, comprising a silicon substrate formed with a back hole therein and an acoustic sensing part supported on the silicon substrate and aligned with the back hole; and a first packaging unit, wherein the MEMS microphone unit and/or the first packaging unit comprise ASICs, wherein the MEMS microphone unit and the first packaging unit are aligned, the MEMS microphone unit is bonded to the first packaging unit with the back hole side of the MEMS microphone unit being away from the first packaging unit, and wherein the electrical connections among the acoustic sensing part, the ASICs and surface mountable pads formed on the outer side of the first packaging unit are realized by interconnection wires or conductive pads or through-silicon-vias or the combination thereof.

The method for manufacturing the fully wafer-level-packaged MEMS microphone according to the present invention is totally compatible with CMOS MEMS process flow, thus it can guarantee better manufacturability, quality and mass production, and reduce the risk of particle and organic contaminations. The method adopts a parallel multi-wafer process followed by wafer-bonding, thus, minimum yield loss can be ensured due to optimized process flows on different wafers, better performance matching from part to part can be easily achieved, and mechanical robustness can be enhanced by wafer bonding instead of wire bonding. Since a batch of fully wafer-level-packaged MEMS microphones according to the present invention are manufactured in a same process, the performance consistency and the yield thereof can be highly guaranteed. Also, the fully wafer-level-packaged MEMS microphones according to the present invention are fully packaged at wafer level and do not need any further process after die singulation, thus they are cost effective, that is, the total fabrication cost thereof can be much reduced, particularly for small package size, e.g. 6 $mm^2$ or less. Furthermore, the fully wafer-level-packaged MEMS microphones according to the present invention can easily shrink in package size and can fully comply with state-of-the-art customer package specifications.

While various embodiments have been discussed in the summary above, it should be appreciated that not necessarily all embodiments include the same features and some of the features described above are not necessary but can be desirable in some embodiments. Numerous additional features, embodiments and benefits are discussed in the detailed description which follows.

BRIEF DESCRIPTION OF THE DRAWINGS

The objectives and features of the present invention will become apparent from the following description of embodiments, given in conjunction with the accompanying drawings, in which:

FIG. 4 is an enlarged cross-sectional view showing the structures of the first packaging unit, the MEMS microphone unit and the second packaging unit of FIG. 3a;

DETAILED DESCRIPTION

Figure 1:
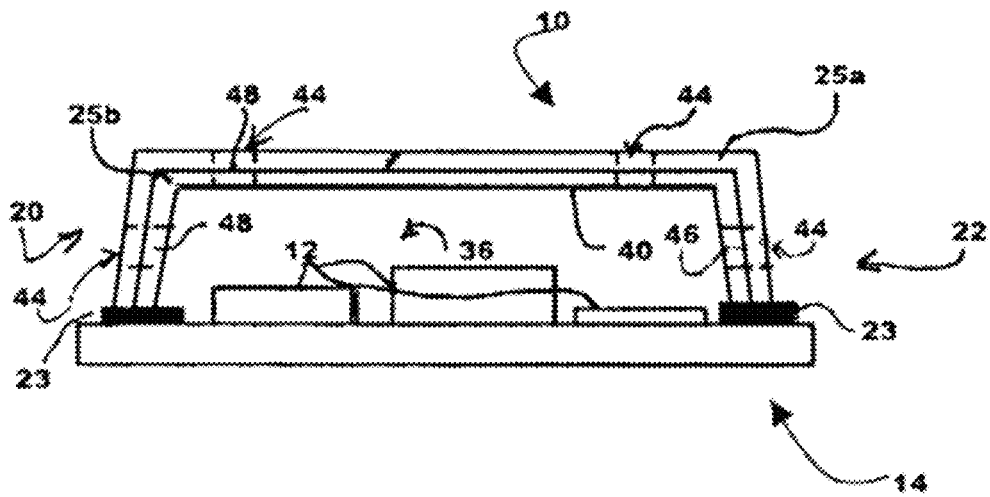
FIG. 1 is a cross-sectional view showing the structure of an MEMS system package in the prior art.
Figure 2:
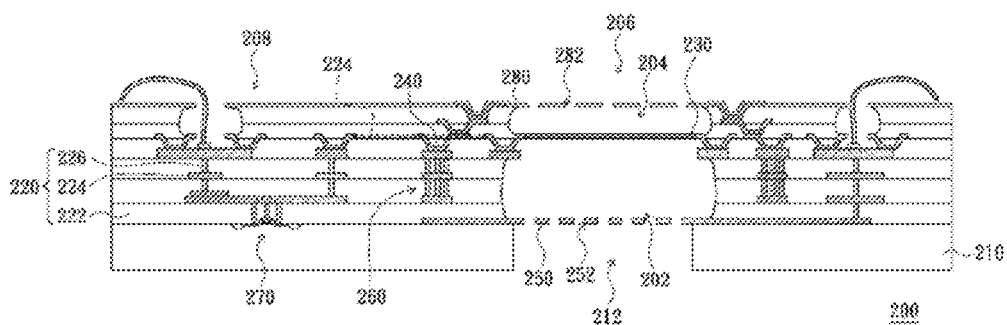
FIG. 2 is a cross-sectional view showing the structure of a wafer level package of MEMS microphone in the prior art.

Various aspects of the claimed subject matter are now described with reference to the drawings, wherein the illustrations in the drawings are schematic and not to scale, and like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diaphragm form in order to facilitate describing one or more aspects.

In the description and the appended claims, it will be understood that, when a layer, a region, or a component is referred to as being "on" or "under" another layer, another region, or another component, it can be "directly" or "indirectly" on or under the another layer, region, or component, or one or more intervening layers may also be present.

Figure 3A:
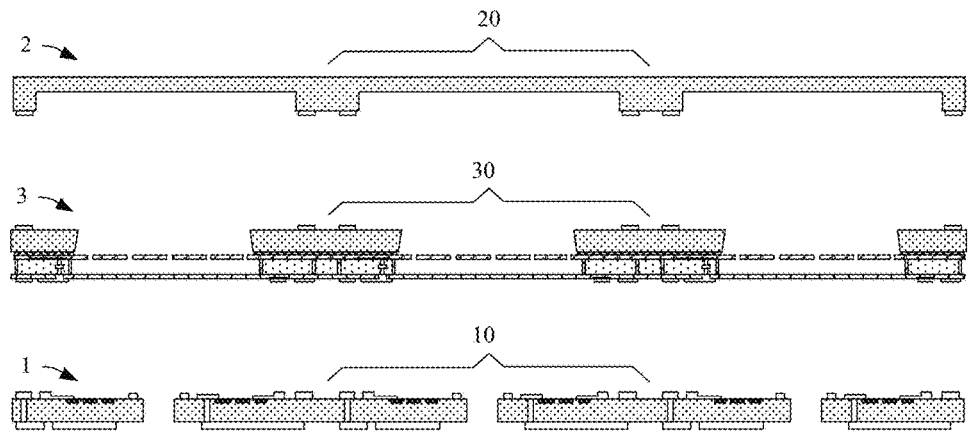
FIG. 3a through 3c are cross-sectional views showing a method for manufacturing a fully wafer-level-packaged MEMS microphone according to an embodiment of the present invention.
Figure 3B:
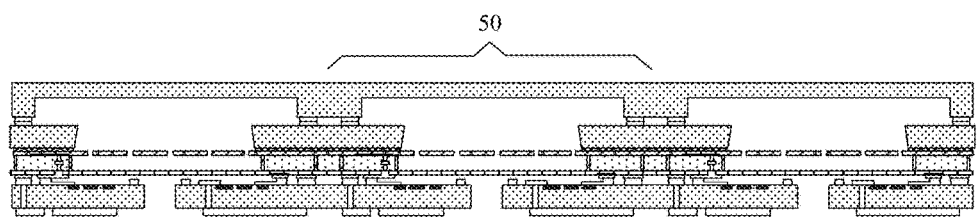
Figure 3C:
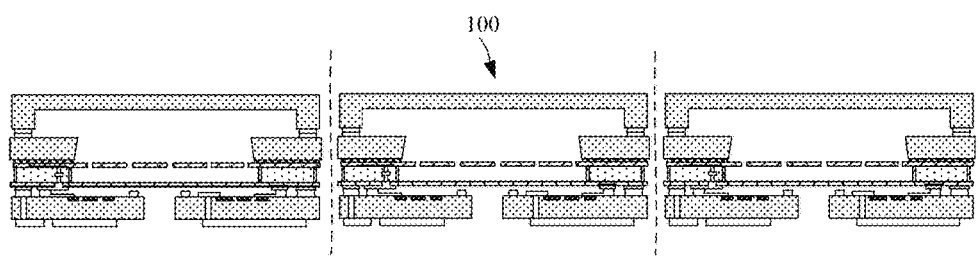

FIG. 3a through 3c are cross-sectional views showing a method for manufacturing a fully wafer-level-packaged MEMS microphone according to an embodiment of the present invention. As shown in FIG. 3a through 3c, the method comprises following steps.

First, as shown in FIG. 3a, separately manufacture a first packaging wafer 1, an MEMS microphone wafer 3 and a second packaging wafer 2, wherein the first packaging wafer 1 comprises a plurality of first packaging units 10, the second packaging wafer 2 comprises a plurality of second packaging units 20, and the MEMS microphone wafer 3 comprises a plurality of MEMS microphone units 30.

Figure 4:
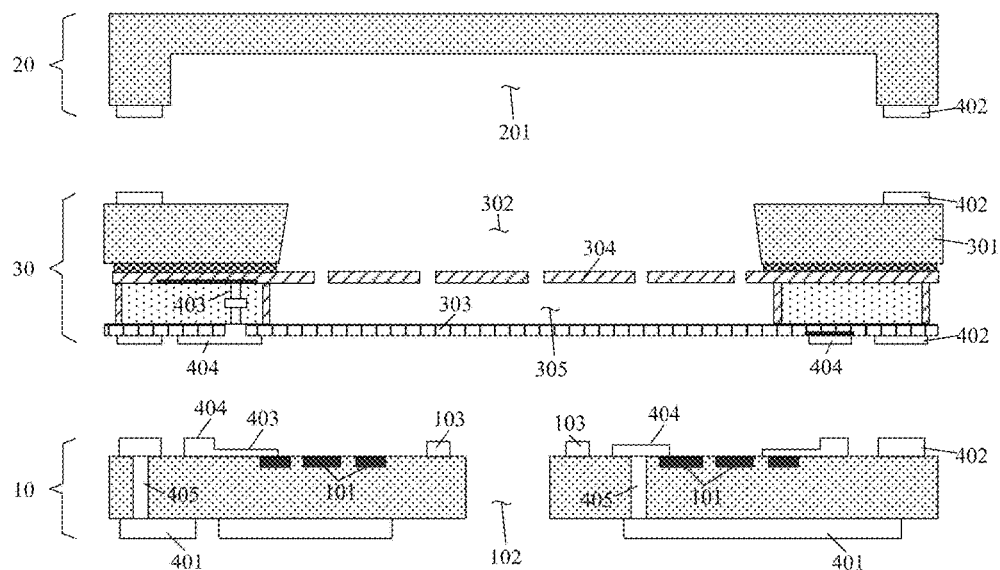

FIG. 4 is an enlarged cross-sectional view showing the structures of the first packaging unit, the MEMS microphone unit and the second packaging unit of FIG. 3a. As shown in FIG. 3a and FIG. 4, each of the MEMS microphone units 30, which is disposed upside down in the figures, may comprise a silicon substrate 301 formed with a back hole 302 therein and an acoustic sensing part supported on the silicon substrate 301 and aligned with the back hole 302. The acoustic sensing part may receive an external acoustic signal and transform the received acoustic signal into an electrical signal, and preferably may at least include: a compliant diaphragm 303; a perforated backplate 304; and an air gap 305 formed between the diaphragm 303 and the backplate 304, wherein the diaphragm 303 and the backplate 304 are used to form electrode plates of a variable condenser. An example of the acoustic sensing part is described in details, for example, in the international application No. PCT/CN2010/075514, and detailed description thereof will be omitted herein.

In the present embodiment, the acoustic sensing part includes a perforated backplate 304 supported on the silicon substrate 301 and a compliant diaphragm 303 supported on the backplate 304 with an air gap 305 sandwiched in between, however, the present invention is not limited thereto. In other embodiment, the acoustic sensing part may includes a compliant diaphragm 303 supported on the silicon substrate 301 and a perforated backplate 304 supported on the diaphragm 303 with an air gap 305 sandwiched in between.

In the present embodiment, the first packaging unit 10 may comprise the ASICs (Application Specific Integrated Circuits) 101 and an acoustic port 102. The ASICs 101 may process the electrical signal output by the acoustic sensing part and perform other functions. The acoustic port 102 allows the external acoustic wave reach the acoustic sensing part from the one side thereof. Also, in the present embodiment, the second packaging unit 20 may comprise a cavity 201, and the surface mountable pads 401 are formed on the outer side of the first packaging unit 10. Further preferably, dimples 103 may be formed on the inner side of the first packaging unit 10 to protect the diaphragm 303 from sticking thereto, as described later on.

However, the present invention is not limited thereto. Actually, the ASICs can located on any one or two of the first packaging unit, the second packaging unit, and the MEMS microphone unit, or located on three of them according to device design and performance matching consideration. Also, the acoustic port can dwelt on either the first packaging unit or the second packaging unit according to the structure and orientation of the acoustic sensing part. In addition, the surface mountable pads may be formed on the outer side of the first packaging unit and/or the outer side of the second packaging unit for sake of convenient electrical connections.

For example, in another embodiment of the present invention, the first packaging unit may comprise an acoustic port, the second packaging unit may comprise the ASICs, and the surface mountable pads may be formed on the outer side of the first packaging unit. Furthermore, the acoustic sensing part may include a perforated backplate supported on the silicon substrate and a compliant diaphragm supported on the backplate with an air gap sandwiched in between, and dimples may be formed on the inner side of the first packaging unit to protect the diaphragm from sticking thereto.

Referring to the FIG. 3b, after the first packaging wafer 1, the MEMS microphone wafer 3 and the second packaging wafer 2 are manufactured separately, perform wafer-to-wafer bonding for the MEMS microphone wafer 3 and the first packaging wafer 1 and for the second packaging wafer 2 and the MEMS microphone wafer 3, such that the first packaging units 10, the MEMS microphone units 30 and the second packaging units 20 are correspondingly aligned to form a plurality of fully wafer-level-packaged MEMS microphone units 50. The wafer-to-wafer bonding may be realized by any of metal-metal bonding (e.g. Au—Au, Al—Al or Cu—Cu bonding, etc), metal eutectic bonding (e.g. SnAu eutectic, etc), soldering, and conductive adhesive bonding, i.e. the bonding rings 402 formed on the first packaging units 10, the MEMS microphone units 30 and the second packaging units 20 can be made of metal, solders, or conductive adhesives.

In each of fully wafer-level-packaged MEMS microphone units 50, the electrical connections among the acoustic sensing part, the ASICs 101 and surface mountable pads 401 may be realized by interconnection wires 403 or conductive pads 404 or through-silicon-vias 405 or the combination thereof. Bonding rings 402 may or may not be involved in the electrical connections.

Referring to the FIG. 3c, after the wafer-to-wafer bonding step, singulate the fully wafer-level-packaged MEMS microphone units 50 to form a plurality of fully wafer-level-packaged MEMS microphones 100. The fully wafer-level-packaged MEMS microphones 100 are ready for testing or shipping, and do not need any further process for final utilization.

Hereinafter, embodiments of the fully wafer-level-packaged MEMS microphone manufactured by the above method of the present invention will be described with reference to FIG. 5 and FIG. 6. In the following description, for sake of clarity and conciseness, a lot of processing details, such as equipments, conditions, parameters and so on, are omitted in considering that they are well known by those skilled in the art.

A fully wafer-level-packaged MEMS microphone manu-factured by the method of the present invention may comprise: a first packaging unit; an MEMS microphone unit, comprising a silicon substrate formed with a back hole therein and an acoustic sensing part supported on the silicon substrate and aligned with the back hole, and a second packaging unit, wherein the first packaging unit and/or the second packaging unit and/or the MEMS microphone unit comprise ASICs, and the first packaging unit or the second packaging unit also comprises an acoustic port, wherein the first packaging unit, the MEMS microphone unit and the second packaging unit are aligned, the MEMS microphone unit is bonded to the first packaging unit and the second packaging unit is bonded to the MEMS microphone unit, and wherein the electrical connections among the acoustic sensing part, the ASICs and surface mountable pads formed on the outer side of the first packaging unit and/or the outer side of the second packaging unit are realized by interconnection wires or conductive pads or through-silicon-vias or the combination thereof.

Preferably, the acoustic sensing part may at least include: a compliant diaphragm; a perforated backplate; and an air gap formed between the diaphragm and the backplate, wherein the diaphragm and the backplate are used to form electrode plates of a variable condenser.

Figure 5:
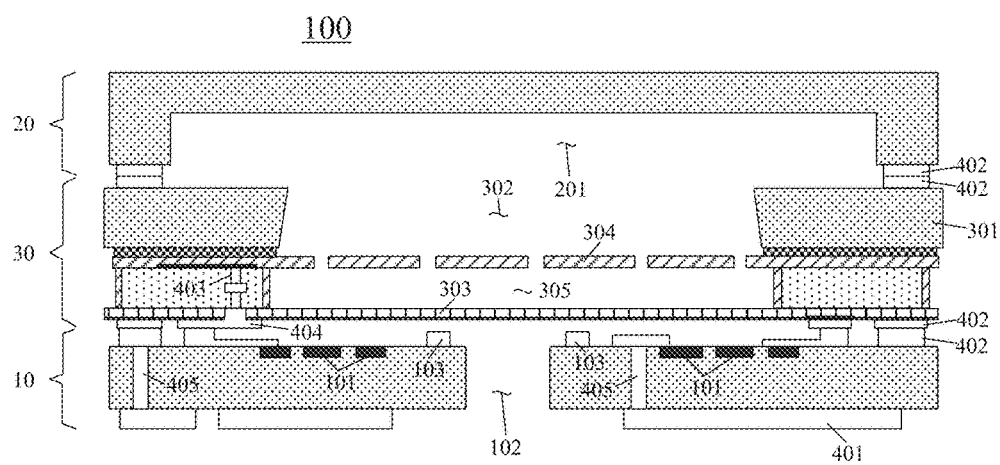
FIG. 5 is a cross-sectional view showing the structure of the fully wafer-level-packaged MEMS microphone according to an embodiment of the present invention.

FIG. 5 is a cross-sectional view showing the structure of the fully wafer-level-packaged MEMS microphone according to an embodiment of the present invention. As shown in FIG. 5, in the fully wafer-level-packaged MEMS microphone 100 according to an embodiment of the present invention, specifically, the first packaging unit 10 comprises the ASICs 101 and an acoustic port 102, the second packaging unit 20 comprises a cavity 201, the back hole 302 in the MEMS microphone unit 30 and the cavity 201 are merged to form a back chamber, and the surface mountable pads 401 are formed on the outer side of the first packaging unit 10. The MEMS microphone unit 30 and the first packaging unit 10 as well as the second packaging unit 20 and the MEMS microphone unit 30 are bonded by bonding rings 402.

In addition, the acoustic sensing part includes a perforated backplate 304 supported on the silicon substrate 301 and a compliant diaphragm 303 supported on the backplate 304 with an air gap 305 sandwiched in between. Furthermore, dimples 103 are formed on the inner side of the first packaging unit 10 to protect the diaphragm 303 from sticking thereto.

The electrical connections among the acoustic sensing part, the ASICs 101 and surface mountable pads 401 are realized by interconnection wires 403 or conductive pads 404 or through-silicon-vias 405 or the combination thereof.

Figure 6:
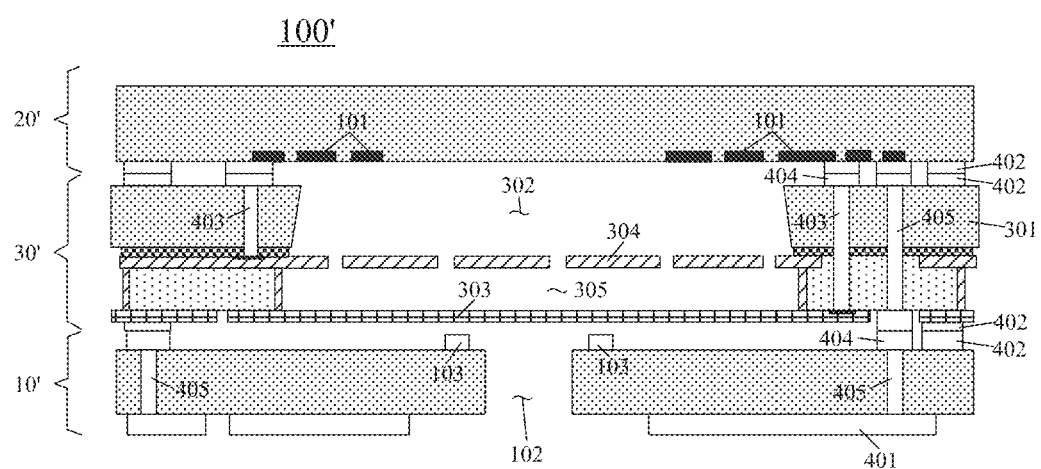
FIG. 6 is a cross-sectional view showing the structure of the fully wafer-level-packaged MEMS microphone according to another embodiment of the present invention.

FIG. 6 is a cross-sectional view showing the structure of the fully wafer-level-packaged MEMS microphone according to another embodiment of the present invention. As shown in FIG. 6, in the fully wafer-level-packaged MEMS microphone 100' according to another embodiment of the present invention, specifically, the first packaging unit 10' comprises an acoustic port 102, the second packaging unit 20' comprises the ASICs 101, and the surface mountable pads 401 are formed on the outer side of the first packaging unit 10'. The MEMS microphone unit 30' and the first packaging unit 10' as well as the second packaging unit 20' and the MEMS microphone unit 30' are bonded by bonding rings 402.

In addition, the acoustic sensing part includes a perforated backplate 304 supported on the silicon substrate 301 and a compliant diaphragm 303 supported on the backplate 304 with an air gap 305 sandwiched in between. Furthermore, dimples 103 are formed on the inner side of the first packaging unit 10' to protect the diaphragm 303 from sticking thereto.

The electrical connections among the acoustic sensing part, the ASICs 101 and surface mountable pads 401 are realized by interconnection wires 403 or conductive pads 404 or through-silicon-vias 405 or the combination thereof.

The above described method of the present invention and the fully wafer-level-packaged MEMS microphone manufactured with the same can be further simplified.

Figure 7A:
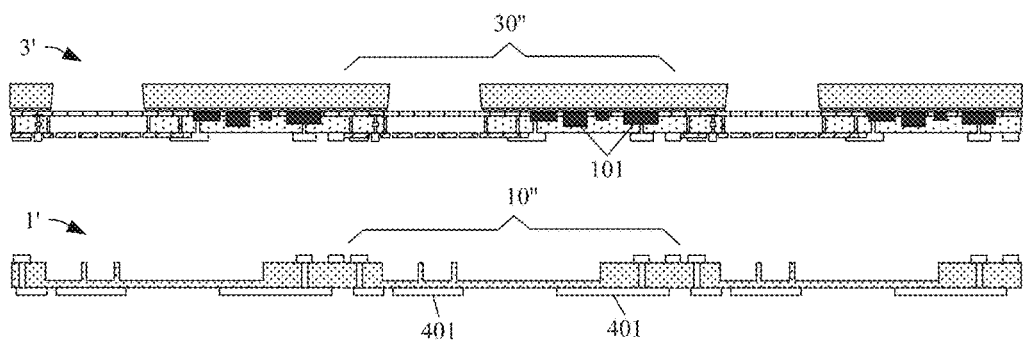
FIG. 7a through 7c are cross-sectional views showing a method for manufacturing a fully wafer-level-packaged MEMS microphone according to another embodiment of the present invention.
Figure 7B:
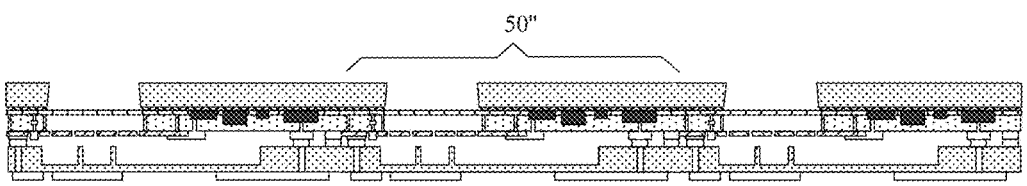
Figure 7C:
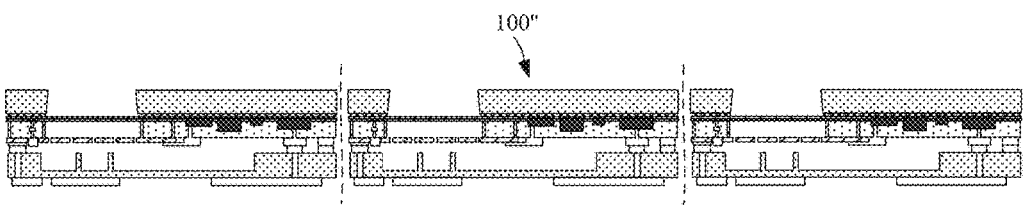

FIG. 7a through 7c are cross-sectional views showing a method for manufacturing a fully wafer-level-packaged MEMS microphone according to another embodiment of the present invention. As shown in FIG. 7a through 7c, the method comprises following steps.

First, as shown in FIG. 7a, separately manufacture a first packaging wafer 1', an MEMS microphone wafer 3', wherein the first packaging wafer 1' comprises a plurality of first packaging units 10", and the MEMS microphone wafer 3' comprises a plurality of MEMS microphone units 30".

Each of the MEMS microphone units 30", which is disposed upside down in FIG. 7a, may comprises a silicon substrate formed with a back hole therein and an acoustic sensing part supported on the silicon substrate and aligned with the back hole, as described above. Also, the MEMS microphone unit 30" comprises ASICs 101, which are integrated with the acoustic sensing part on the MEMS microphone unit 30'. However, the present invention is not limited thereto. Actually, according to the present invention, ASICs can be located on the first packaging units and/or the MEMS microphone units.

The surface mountable pads 401 are formed on the outer side of the first packaging unit 10". In addition, preferably, the first packaging unit 10" may comprises a cavity.

Referring to FIG. 7b, after the first packaging wafer 1' and the MEMS microphone wafer 3' are manufactured separately, perform wafer-to-wafer bonding for the MEMS microphone wafer 3' and the first packaging wafer 1' with the back hole side of the MEMS microphone wafer 3' being away from the first packaging wafer 1' (i.e. the back hole is on the top, and the acoustic sensing part is closed to the first packaging wafer 1'), such that the first packaging units 1' and the MEMS microphone units 3' are correspondingly aligned to form a plurality of fully wafer-level-packaged MEMS microphone units 50".

In each of the fully wafer-level-packaged MEMS microphone units 50", the electrical connections among the acoustic sensing part, the ASICs and surface mountable pads formed on the outer side of the first packaging unit 1' are realized by interconnection wires or conductive pads or through-silicon-vias or the combination thereof.

Referring to FIG. 7c, after the wafer-to-wafer bonding step, singulate the fully wafer-level-packaged MEMS microphone units 50" to form a plurality of fully wafer-level-packaged MEMS microphones 100". The fully wafer-level-packaged MEMS microphones 100" are ready for testing or shipping, and do not need any further process for final utilization.

Hereinafter, an embodiment of the fully wafer-level-packaged MEMS microphone manufactured by the method shown in FIG. 7a-7c will be briefly described with reference to FIG. 8. In the following description, for sake of clarity and conciseness, details elaborated hereinbefore will not be repeated.

Figure 8:
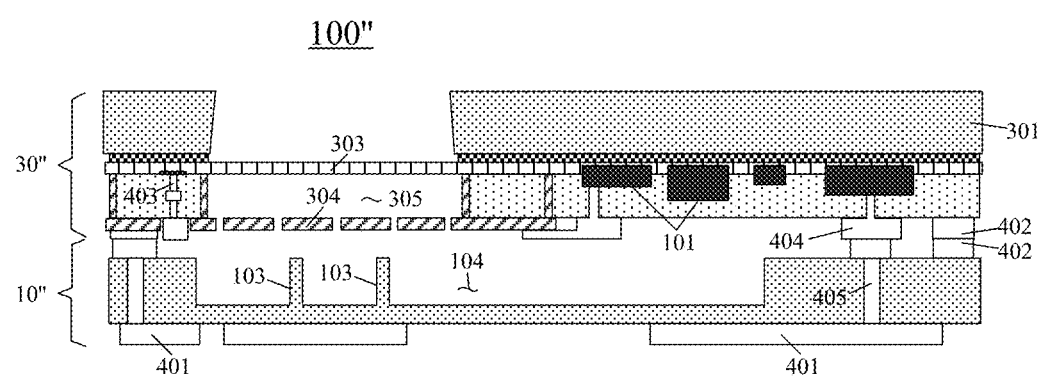
FIG. 8 is a cross-sectional view showing the structure of the fully wafer-level-packaged MEMS microphone according to still another embodiment of the present invention.

FIG. 8 is a cross-sectional view showing the structure of the fully wafer-level-packaged MEMS microphone according to still another embodiment of the present invention. As shown in FIG. 8, a fully wafer-level-packaged MEMS microphone 100" according to still another embodiment of the present invention may comprise: a first packaging unit 10"; and an MEMS microphone unit 30" comprising a silicon substrate 301 formed with a back hole 302 therein and an acoustic sensing part supported on the silicon substrate 301 and aligned with the back hole 302. The acoustic sensing part may include: a compliant diaphragm 303; a perforated backplate 304; and an air gap 305 formed in between, the diaphragm 303 and the backplate 304 are used to form electrode plates of a variable condenser.

The acoustic sensing part and the ASICs 101 are integrally formed on the MEMS microphone unit 30", however, the present invention is not limited thereto. In other embodiments, the ASICs 101 may located on the MEMS microphone unit and/or the first packaging unit according to device design.

The MEMS microphone unit 30" and the first packaging unit 10" are aligned, the MEMS microphone unit 30" is bonded to the first packaging unit 10" through the bonding rings 402 with the back hole side of the MEMS microphone unit 30" being away from the first packaging unit 10", that is, the back hole 302 of the MEMS microphone unit 30" is on the top, and the acoustic sensing part is closed to the first packaging unit 10".

The electrical connections among the acoustic sensing part, the ASICs 101 and surface mountable pads 401 formed on the outer side of the first packaging unit 10" are realized by interconnection wires 403 or conductive pads 404 or through-silicon-vias 405 or the combination thereof.

In addition, a cavity 104 and dimples 103 may be formed on the first packaging unit 10" to improve the acoustic performance and the robustness of the microphone 100".

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

The invention claimed is:

1. A method of manufacturing a fully wafer-level-packaged MEMS microphone, comprising:
    separately manufacturing a first packaging wafer, a MEMS microphone wafer and a second packaging wafer, wherein the first packaging wafer comprises a plurality of first packaging units, the second packaging wafer comprises a plurality of second packaging units, and the MEMS microphone wafer comprises a plurality of MEMS microphone units, each of which comprises a silicon substrate formed with a back hole therein and an acoustic sensing part supported on the silicon substrate and aligned with the back hole that comprise a portion of a back chamber between the first packaging unit and the silicon substrate, and wherein the first packaging units and/or the second packaging units and/or the MEMS microphone units comprise ASICs, and the first packaging units or the second packaging units also comprise acoustic ports for allowing an acoustic signal to reach the acoustic sensing part;
    performing wafer-to-wafer bonding for the MEMS microphone wafer and the first packaging wafer and for the second packaging wafer and the MEMS microphone wafer, such that the first packaging units, the MEMS microphone units and the second packaging units are correspondingly aligned to form a plurality of fully wafer-level-packaged MEMS microphone units, in each of which electrical connections among the acoustic sensing part, the ASICs and surface mountable pads formed on the outer side of each of the first packaging unit and/or the outer side of each of the second packaging unit are realized by interconnection wires or conductive pads or through-silicon-vias or the combination thereof;
    singulating the fully wafer-level-packaged MEMS microphone units to form a plurality of fully wafer-level-packaged MEMS microphones.

2. The method of claim 1, wherein the acoustic sensing part at least includes: a compliant diaphragm; a perforated backplate; and an air gap formed between the diaphragm and the backplate, wherein the diaphragm and the backplate are used to form electrode plates of a variable condenser.

3. The method of claim 1, wherein the wafer-to-wafer bonding is realized by any of metal-metal bonding, metal eutectic bonding, soldering, and conductive adhesive bonding.

4. The method of claim 1, wherein in each of the fully wafer-level-packaged MEMS microphone units, the first packaging unit comprises the ASICs and the acoustic port, the second packaging unit comprises a cavity, the back hole in the MEMS microphone unit and the cavity are merged to form the back chamber, and the surface mountable pads are formed on the outer side of the first packaging unit.

5. The method of claim 4, wherein in each of the fully wafer-lever-packaged MEMS microphone units, the acoustic sensing part includes a perforated backplate supported on the silicon substrate and a compliant diaphragm supported on the backplate with an air gap sandwiched therebetween, and wherein dimples are formed on the inner side of the first packaging unit to protect the diaphragm from sticking thereto.

6. The method of claim 1, wherein in each of the fully wafer-level-packaged MEMS microphone units, the first packaging unit comprises the acoustic port, the second packaging unit comprises the ASICs, and the surface mountable pads are formed on the outer side of the first packaging unit.

7. The method of claim 6, wherein in each of the fully wafer-level-packaged MEMS microphone units, the acoustic sensing part includes a perforated backplate supported on the silicon substrate and a compliant diaphragm supported on the backplate with an air gap sandwiched therebetween, and wherein dimples are formed on the inner side of the first packaging unit to protect the diaphragm from sticking thereto.

8. A fully wafer-level-packaged MEMS microphone, comprising:
    a first packaging unit;
    a MEMS microphone unit, comprising a silicon substrate formed with a back hole therein, and an acoustic sensing part supported on the silicon substrate and aligned with the back hole that comprise a portion of a back chamber between the first packaging unit and the silicon substrate; and
    a second packaging unit,
    wherein the first packaging unit and/or the second packaging unit and/or the MEMS microphone unit comprise ASICs, and the first packaging unit or the second packaging unit also comprises an acoustic port for allowing an acoustic signal to reach the acoustic sensing part, wherein the first packaging unit, the MEMS microphone unit and the second packaging unit are aligned, the MEMS microphone unit is bonded to the first packaging unit and the second packaging unit is bonded to the MEMS microphone unit, and wherein the electrical connections among the acoustic sensing part, the ASICs and surface mountable pads formed on the outer side of the first packaging unit and/or the outer side of the second packaging unit are realized by interconnection wires or conductive pads or through-silicon-vias or the combination thereof.

9. The fully wafer-level-packaged MEMS microphone of claim 8, wherein the acoustic sensing part at least includes: a compliant diaphragm; a perforated backplate; and an air gap formed between the diaphragm and the backplate, wherein the diaphragm and the backplate are used to form electrode plates of a variable condenser.

10. The fully wafer-level-packaged MEMS microphone of claim 8, wherein the first packaging unit comprises the ASICs and the acoustic port, the second packaging unit comprises a cavity, the back hole in the MEMS microphone unit and the cavity are merged to form the back chamber, and the surface mountable pads are formed on the outer side of the first packaging unit.

11. The fully wafer-level-packaged MEMS microphone of claim 10, wherein the acoustic sensing part includes a perforated backplate supported on the silicon substrate and a compliant diaphragm supported on the backplate with an air gap sandwiched therebetween, and wherein dimples are formed on the inner side of the first packaging unit to protect the diaphragm from sticking thereto.

12. The fully wafer-level-packaged MEMS microphone of claim 8, wherein the first packaging unit comprises the acoustic port, the second packaging unit comprises the ASICs, and the surface mountable pads are formed on the outer side of the first packaging unit.

13. The fully wafer-level-packaged MEMS microphone of claim 12, wherein the acoustic sensing part includes a perforated backplate supported on the silicon substrate and a compliant diaphragm supported on the backplate with an air gap sandwiched therebetween, and wherein dimples are formed on the inner side of the first packaging unit to protect the diaphragm from sticking thereto.

14. A method of manufacturing a fully wafer-level-packaged MEMS microphone, comprising:

separately manufacturing a first packaging wafer, a MEMS microphone wafer, wherein the first packaging wafer comprises a plurality of first packaging units, and the MEMS microphone wafer comprises a plurality of MEMS microphone units, each of which comprises a silicon substrate formed with a back hole therein, and an acoustic sensing part supported on the silicon substrate and aligned with the back hole that comprises a portion of a back chamber between the first packaging unit and the silicon substrate, and wherein the first packaging units and/or the MEMS microphone units comprise ASICs;

performing wafer-to-wafer bonding for the MEMS microphone wafer and the first packaging wafer with the back hole side of the MEMS microphone wafer being away from the first packaging wafer, such that the first packaging units and the MEMS microphone units are correspondingly aligned to form a plurality of fully wafer-level-packaged MEMS microphone units, in each of which the electrical connections among the acoustic sensing part, the ASICs and surface mountable pads formed on the outer side of the first packaging unit are realized by interconnection wires or conductive pads or through-silicon-vias or the combination thereof;

singulating the fully wafer-level-packaged MEMS microphone units to form a plurality of fully wafer-level-packaged MEMS microphones.

15. The method of claim 14, wherein in each of the fully wafer-level-packaged MEMS microphone units, the acoustic sensing part and the ASICs are integrally formed on the MEMS microphone unit, and the surface mountable pads are formed on the outer side of the first packaging unit.

* * * * *